United States Patent [19]

Igarashi et al.

[11] Patent Number: 5,031,571
[45] Date of Patent: Jul. 16, 1991

[54] APPARATUS FOR FORMING A THIN FILM ON A SUBSTRATE

[75] Inventors: Takashi Igarashi; Nobuhiro Fukuda, both of Yokohama, Japan

[73] Assignee: Mitsui Toatsu Chemicals, Inc., Tokyo, Japan

[21] Appl. No.: 301,138

[22] Filed: Jan. 25, 1989

[30] Foreign Application Priority Data

Feb. 1, 1988 [JP] Japan ................. 63-19675
Mar. 7, 1988 [JP] Japan ................. 63-51728
Mar. 7, 1988 [JP] Japan ................. 63-51729
Mar. 8, 1988 [JP] Japan ................. 63-52494
Mar. 8, 1988 [JP] Japan ................. 63-52495
Mar. 8, 1988 [JP] Japan ................. 63-52496

[51] Int. Cl.$^5$ ............................ C23C 16/50
[52] U.S. Cl. ................. 118/723; 422/186.05; 422/186.29; 427/39
[58] Field of Search ............ 118/715, 723; 156/345, 156/643, 646; 204/298.14; 422/186.04, 186.05, 186.29; 427/39

[56] References Cited

U.S. PATENT DOCUMENTS

| 4,209,357 | 6/1980 | Gorin et al. | 156/345 |
| 4,590,042 | 5/1986 | Drage | 156/345 |
| 4,612,077 | 9/1986 | Tracy et al. | 156/345 |
| 4,659,401 | 4/1987 | Reif et al. | 427/39 |
| 4,689,093 | 8/1987 | Ishihara et al. | 427/39 |
| 4,767,641 | 8/1988 | Kieser et al. | 427/38 |
| 4,780,169 | 10/1988 | Stark et al. | 156/345 |

FOREIGN PATENT DOCUMENTS

| 60-128612 | 7/1985 | Japan | 118/723 |
| 60-189928 | 9/1985 | Japan | 118/715 |
| 61-64128 | 4/1986 | Japan | 118/723 |
| 61-194180 | 8/1986 | Japan | 118/723 |
| 61-256639 | 11/1986 | Japan | 118/723 |
| 62-13573 | 1/1987 | Japan | 118/723 |
| 62-60875 | 3/1987 | Japan | 118/723 |
| 62-142314 | 6/1987 | Japan | 118/723 |
| 62-199019 | 9/1987 | Japan | 118/715 |

Primary Examiner—Norman Morgenstern
Assistant Examiner—Terry J. Owens
Attorney, Agent, or Firm—Fisher, Christen & Sabol

[57] ABSTRACT

A film-forming apparatus comprising a high-frequency application electrode and an earth electrode. The high-frequency applying electrode has an uneven surface with projections and recesses. An amorphous silicon film is formed uniformly on a substrate at a high speed by feeding a silicon-based gas into this apparatus and generating a glow discharge between the high-frequency application electrode and the earth electrode, and positioning the substrate in an atmosphere of the generated glow discharge.

4 Claims, 6 Drawing Sheets

APPARATUS FOR FORMING A THIN FILM ON A SUBSTRATE

This invention relates to a film-forming apparatus for forming a film continuously by glow discharge, and particularly to an apparatus for uniformly forming a semiconductor film having high performance at a high speed.

BACKGROUND OF THE INVENTION

An amorphous silicon semiconductor film obtained by glow discharge decomposition or photo-decomposition of a silicon compound has an excellent ability to convert light into an electrical energy, and is utilized as a photovoltaic device. Utilization of it not only in everyday instruments such as electronic portable calculators but also in solar cells for power generation has been considered. For this purpose, it is necessary to produce solar cells of a large area at low cost. Amorphous silicon-type solar cells can be relatively easily increased in area, and research is under way for increasing their area.

Some problems arise in uniformly forming a semiconductor film of high performance at a high film-forming speed in a film-forming apparatus including conventional parallel plate electrodes of the capacitive coupling type. Firstly, in this apparatus, a substrate for forming a film thereon is positioned between an electrode to which a high frequency is applied (high-frequency application electrode) and an earth electrode. The uniformity of the film in this case cannot be obtained unless the uniformity of glow discharge is secured within the plane of the high-frequency application electrode. Secondly, when a film is to be formed on a substrate of a large area, the area of the high-frequency application electrode should naturally be made larger than that of the substrate. However, in an electrode of a large area, a skin effect inherent to a high-frequency current is produced and the high-frequency current cannot be effectively and uniformly introduced. Furthermore, the aforesaid skin effect and an end effect based on the line of electric force cause glow discharge to occur strongly in the peripheral part of the high-frequency application electrode, and the speed of film formation becomes non-uniform. Moreover, the properties of the resulting thin film are also become non-uniform. In particular, under high-speed film-forming conditions, glow discharge becomes stronger in the peripheral part of the high-frequency application electrode, and such problems become more outstanding.

SUMMARY OF THE INVENTION

It is an object of this invention to provide a film-forming apparatus which can form a uniform semiconductor film on a substrate at a high film-forming speed by generating a high-concentration plasma between a high-frequency application electrode and an earth electrode.

According to this invention, there is provided an apparatus for forming a film on a substrate, comprising a high-frequency application electrode and an earth electrode, said high-frequency application electrode having an uneven surface with a hill and a valley.

According to another aspect of this invention, there is provided a method of forming an amorphous silicon film, which comprises feeding a silicon-based gas into the above apparatus, generating a glow discharge between the high-frequency application electrode and the earth electrode, positioning the substrate in an atmosphere of the generated glow discharge, and thereby forming an amorphous silicon film on the substrate.

DETAILED DESCRIPTION OF THE INVENTION

Figure 1:
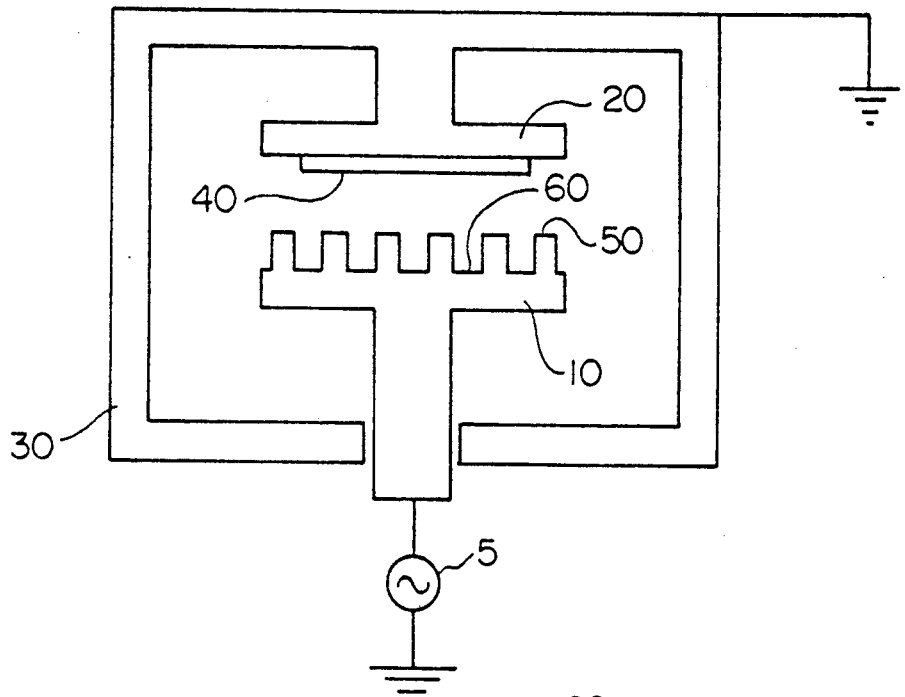
FIG. 1 is a schematic view showing the film-forming apparatus of this invention.

FIG. 1 is a schematic view of the film-forming apparatus 30 of the invention comprising a high-frequency application electrode 10, an earth electrode 20 and a high-frequency power supply 5. The high-frequency application electrode 10 has a surface consisting of projections 50 and recesses 60. A substrate 40 is positioned in an atmosphere of a glow discharge generated between the uneven high-frequency application electrode and the earth electrode, and a film, particularly a semiconductor film, is formed on the substrate 40.

Figure 2:
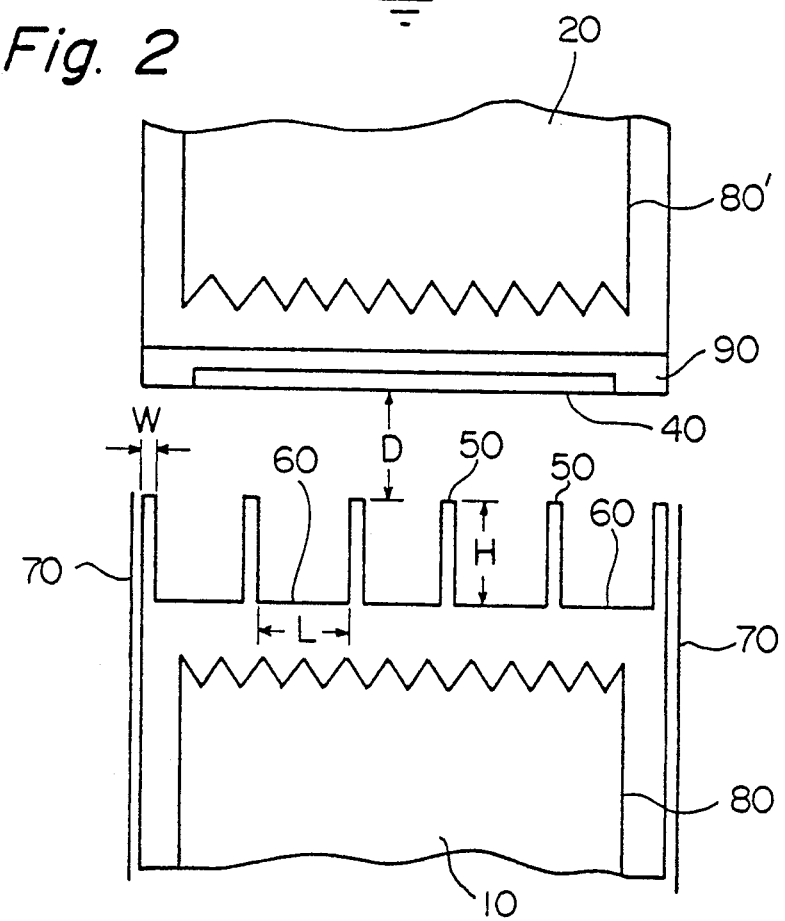
FIG. 2 is an enlarged sectional view of the electrode portions in the film-forming apparatus of this invention.

FIG. 2 is a sectional view of the electrode portions on an enlarged scale. W represents the width of a projection; L, the width of a recess; and H, the height of a projection.

Figure 3:
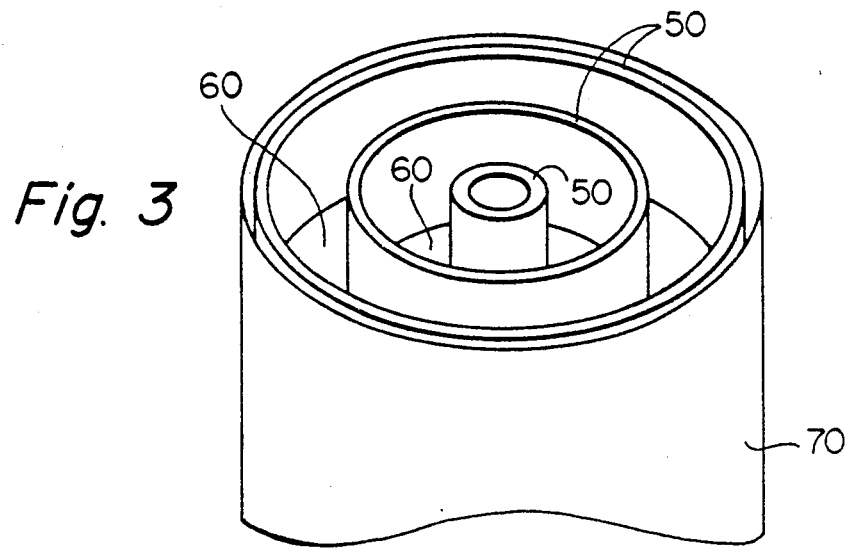
FIGS. 3 to 5 are perspective views showing three examples of the arrangement of projections and recesses on the surface of the high-frequency application electrode.
Figure 4:
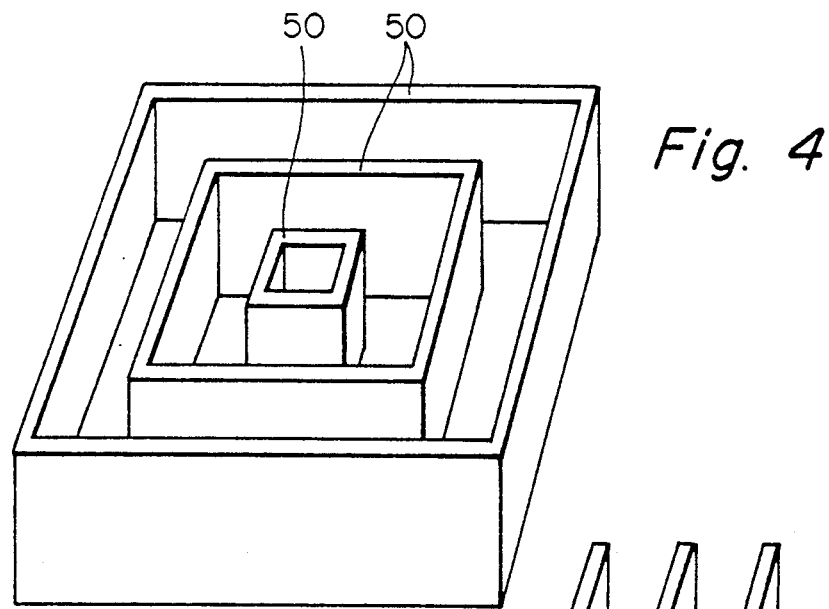
Figure 5:
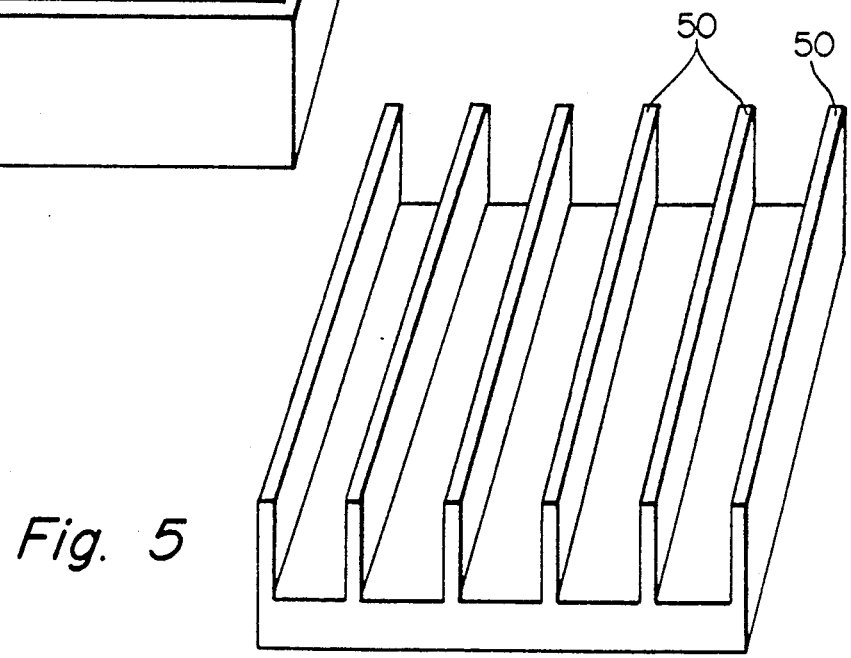

In the apparatus of this invention, the uneven shape of the surface of the high-frequency application electrode is not particularly limited. For example, as shown in FIG. 3, the projections and recesses may be arranged in a concentric circular form, or as shown in FIG. 4, they may be arranged in a concentric square form. They may also be arranged in a straight line parallel to each other at predetermined intervals as shown in FIG. 5.

The projection height H, i.e. the depth of a depressed portion in the uneven surface of the high frequency application electrode shown in FIG. 2 is at least 1/5 of the distance D between the apex of a raised portion (projection) of the high frequency application electrode and the substrate (electrode distance), and preferably made equal to, or more than, D. Since under high-speed film-forming conditions, it is required to increase the pressure during film formation, the effect of forming the surface of the electrode in raised and depressed state is small if the hill height H is as small as less than 1/5 of the electrode distance D. The electrode distance D is 10 mm to 500 mm, preferably about 20 mm to 100 mm. The uniformity of the film is affected also by the shape of the apparatus, for example by the distance between the high frequency application electrode and the earth electrode and the distance between the high frequency application electrode and the substrate. The effects of the shape of the apparatus can be obviated almost completely by adjusting the projection height of the high frequency application electrode to at least 1/5 of the electrode distance D, and preferably making it equal to, or more than, the distance D.

On the other hand, the projection width W, i.e. the width of a raised portion, in the uneven surface of the high frequency application electrode shown in FIG. 2 is less than the electrode distance D, preferably 0.1 mm to 50 cm, more preferably 0.1 mm to 10 cm. If the projection width W is larger than the electrode distance D, the effect of the uneven surface of the electrode to perform uniform film formation is small and not desirable.

The effects of the shape of the apparatus can be obviated almost completely by adjusting the projection width of the high frequency application electrode to below the electrode distance D. In this case, too, there is no particular limitation on the distance between the high frequency application electrode and the earth electrode and the distance between the high frequency application electrode and the substrate.

The width L of a recess in the uneven surface of the high frequency application electrode shown in FIG. 2 is equal to, or larger than, the electrode distance D, and preferably 0.5 mm to 50 cm, more preferably 0.5 mm to 10 cm. If the width L is too broad, the effect of the uneven surface of the high frequency application electrode to perform uniform film formation is small.

In the present invention, the surface of the high frequency application electrode is preferably formed in such an uneven shape that the recess width L is equal to, or larger than, the projection width W. The present inventors found that a high concentration plasma generated in the depressed portions is especially desirable for film formation, and it is advisable to utilize the high concentration plasma in the depressed portions fully in film formation. The number of projections and the number of recesses are each about 1 to 100, preferably 2 to 50.

The provision of an earth shield 70 around the high frequency application electrode is not essential in this invention. However, by providing an earth shield around the high frequency electrode, the discharge can be effectively directed toward the opposing earth electrode or toward the substrate. In setting up the earth shield, the distance between the earth shield and the high frequency application electrode is adjusted to 0.1 mm to 2 mm, preferably to about 0.5 mm. Its specific examples are shown in FIGS. 2 and 3.

In the present invention, the electrode size is not limited, and as an area of the electrode projected on a plane, it is about 5 cm×5 cm (or 5 cm in diameter) to about 100 cm×200 cm.

There is no particular restriction on the material of which the high frequency application electrode or the earth electrode is made. In view of the amount of impurities in the resulting semiconductor film, electrical conductivity and thermal stability, stainless steels such as SUS 316 and SUS 304 and aluminum are preferred materials.

The material of which the reactor is made is neither restricted. Stainless steel, nickel, nickel alloys, aluminum and aluminum alloys are preferred materials. In view of handling taken together with processability or corrosion resistance, stainless steel (e.g., SUS 316 and SUS 304), aluminum and aluminum alloys are preferred. The wall of the reactor may be coated with a fluorine-containing resin.

In the present invention, the material of which the substrate is made is neither limited. Examples of materials that can be effectively used as the substrate include a glass sheet, a glass sheet having a transparent electrically conductive coating such as tin oxide or indium tin oxide (ITO), a ceramic plate, a thin plate of a metal such as aluminum, chromium or stainless steel (SUS 316 and SUS 304), a ceramic plate having vapor deposited thereon a metal such as aluminum, chromium or stainless steel (SUS 316, SUS 304), a film of a polymer such as polyethylene terephthalate or polyimide, a stainless steel plate, and a polycrystalline or single crystal silicon wafer.

The film-forming apparatus of this invention may be of the batch type, preferably of the in-line type.

The in-line film-forming apparatus further has the function of conveying the substrate to the film-forming chamber without breaking the vacuum in addition to the functions of the batch-type film-forming apparatus. It comprises at least a substrate loading chamber and a substrate unloading chamber, or a substrate loading chamber concurrently acting as a substrate unloading chamber, or substrate loading means or substrate unloading means performing these functions. A semiconductor film is formed on the substrate which is kept stationary or is being continuously transferred. The film-forming chamber is a metallic reactor equipped with reaction gas introducing means and gas exhausting means, which is equipped at least with heating means for heating the substrate, a high frequency application electrode having an uneven surface, an earth electrode and conveying means for moving a substrate holding device (substrate carrier). The substrate holding device is a conveying device for conveying the substrate while fixing it thereto by, for example, insertion. There is no particular limitation on the method of fixing the substrate to the substrate carrier so long as the main surface of the substrate is exposed and a film can be formed on it. Usually, the substrate holding device is nearly of the same size as the substrate or larger. The material of which the substrate holding device is made is preferably stainless steel (SUS 316, SUS 304) or aluminum in view of the amount of impurities that go into the semiconductor film, electrical conductivity and thermal stability.

The substrate carried on the substrate holding device is placed stationary, or continuously transferred, in a direction perpendicular to a high-frequency plasma generated between the high frequency application electrode and the earth electrode and in a direction parallel to the surface of the high frequency application electrode and the surface of the earth electrode.

Figure 6:
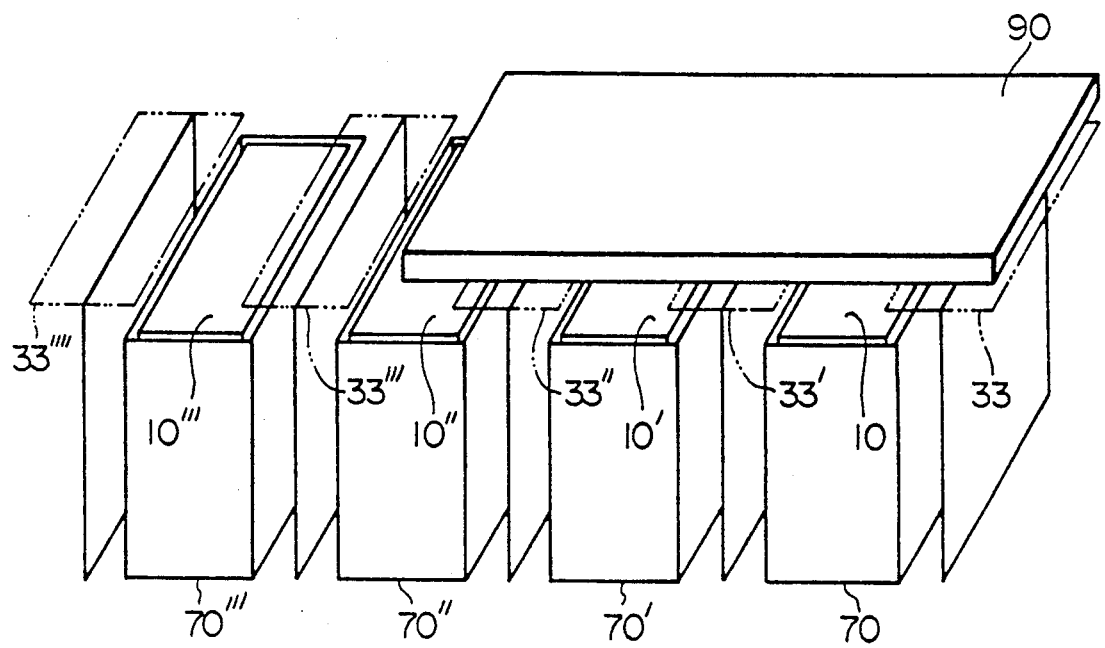
FIG. 6 is a perspective view of an array of a plurality of high-frequency application electrodes.

When the area of the high frequency application electrode is large in this invention, a plurality of high frequency application electrodes 10, 10', 10" and 10''', for example as shown in FIG. 6 may be used together (in FIG. 6, the projections and recesses are omitted). In this arrangement, distance between adjoining electrodes (i.e., the distance between 10 and 10', between 10' and 10", and between 10" and 10''') is not particularly limited, and is usually 20 to 100 mm. By providing earth shields 70, 70', 70" and 70''' in the respective high frequency application electrodes, the discharging can be effectively directed toward the opposing earth electrode. For this purpose, it is preferred to set an inter-electrode distance which permits formation of the earth shields. Specifically, a distance of, for example, at least 5 mm suffices. Preferably, the plurality of high frequency application electrodes are arranged in series as shown in FIG. 6.

The shape of the earth electrode in this invention is not particularly limited.

The film-forming speed can be controlled by applying a bias voltage using plasma controlling electrodes 33, 33', 33'', 33''' and 33'''' shown in FIG. 6.

In the apparatus of this invention, the width L of a recess in the high frequency application electrode may be varied within the above range, most preferably within the range of 0.5 mm to 10 cm, according to the position of the valley on the surface of the high frequency application electrode. For example, the width of a recess in the central part of the electrode surface may be made larger than that recess existing in the peripheral portion (see FIG. 7); or the width of a recess in the peripheral portion is made larger than that of a recess in the central portion (see FIG. 8). If the recess width L is excessively large or small, the high frequency application electrode has a markedly reduced function and effect as one having an uneven surface, and the result would not be much different from that obtained with more parallel plate electrodes used in the prior art.

In the present invention, the recess width L is preferably varied according to the positions of the individual recess on the electrode surface so as to provide a uniform film-forming speed. The basic guideline for it is based on the principle found by the present inventors, namely the principle that the film-forming speed decreases as the recess width L is small, and increases as the recess width L is large. In practice, the optimum value of the recess widths according to the positions of the individual recesses can be determined by repeating a trial film-form operation and analyzing the relation among the positions of the recesses, the widths of the recesses and the thickness of the resulting film. It is also possible to observe the plasma emission and determine the optimum distribution value of the recess width so that the plasma emission becomes uniform. If the plasma emission loses uniformity, the film-forming speed becomes non-uniform and the thickness of the film formed becomes non-uniform. This non-uniformity becomes remarkable under high-speed film-forming conditions which require elevated pressures during film formation.

Furthermore, in the apparatus of this invention, the width W of a projection in the high frequency application electrode may be varied within the above range, most preferably within the range of 0.1 mm to 10 cm, according to the position of the projection on the surface of the high frequency application electrode. For example, the width of a projection in the central part of the electrode surface may be made larger than that of a projection existing in the peripheral portion (see FIG. 9); or the width of a projection in the peripheral portion is made larger than that of a projection in the central portion (see FIG. 10). If the projection width W is excessively large, the high frequency application electrode has a markedly reduced function and effect as one having an uneven surface, and the result would not be much different from that obtained with more parallel plate electrodes used in the prior art. If this width is excessively narrow, the electrode has insufficient mechanical strength and is difficult to use in practice.

In the present invention, the projection width W is preferably varied according to the positions of the individual projections on the electrode surface so as to provide a uniform film-forming speed. The basic guideline for it is based on the principle found by the present inventors, namely the principle that the film-forming speed decreases as the projection width W is small, and increases as the projection width W is large. In practice, the optimum value of the projection widths according to the positions of the individual projections can be determined by repeating a trial film-forming operation and analyzing the relation among the positions of the projections, the widths of the hills and the thickness of the resulting film. It is also possible to observe the plasma emission and determine the optimum distribution value of the projection width so that the plasma emission becomes uniform. If the plasma emission loses uniformity, the film-forming speed becomes non-uniform and the thickness of the film formed becomes non-uniform. This non-uniformity becomes remarkable under high-speed film-forming conditions which require elevated pressures during film formation.

Figure 11:
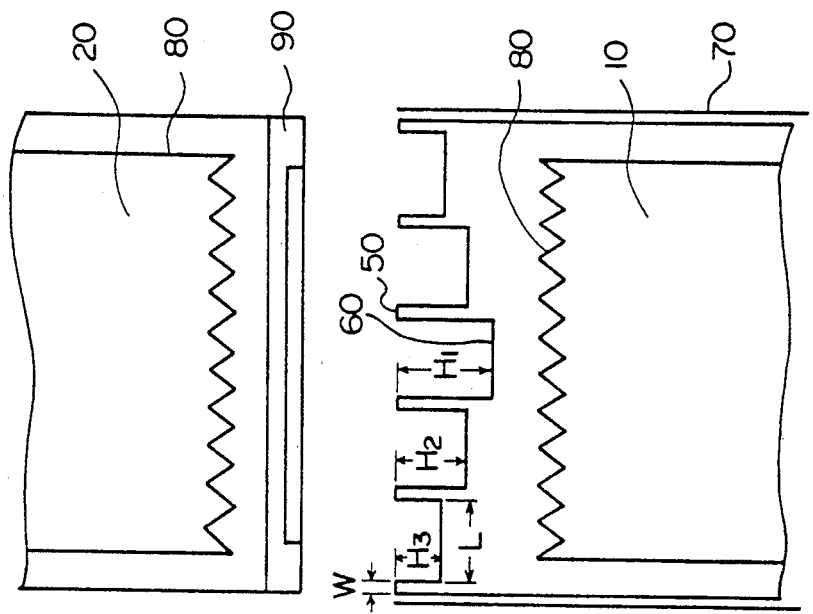

Preferably, the projection height H in the high frequency application electrode is at least 0.5 cm. Its upper limit is 50 cm, preferably 5.0 cm. If the hill height is excessively small, the effect of the uneven surface decreases, and the result would not be much different from that obtained with parallel plate electrodes. The film-forming speed decreases as the projection height is small, and increases as the projection height is large. In the production of a semiconductor film for use in an photovoltaic device, the projection heights may be constant throughout the electrode surface. To increase the uniformity of the film-forming speed further, the projection heights may be properly changed according to the positions of the projections on the electrode surface, for example, as shown in FIG. 11. For example, a film is formed on a trial basis using an electrode having projections of a certain height. If the resulting film is found to have a part corresponding to an excessively low film-forming speed, the height of a projection at a site corresponding to that part is increased. Conversely, if the film has a part corresponding to an excessively high film-forming speed, the height of a projection at a site corresponding to that part is decreased.

Since the projection height greatly affects the film-forming speed, it is preferable to make it variable in order to improve the uniformity of the film-forming speed.

Figure 12:
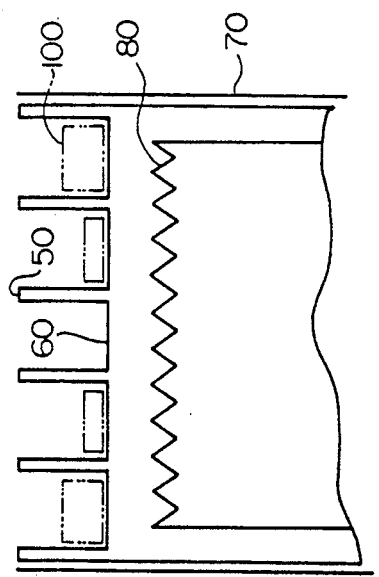

FIG. 12 shows that the projection height has been changed by inserting a filling material 100 having a configuration conforming to the shape of the valley into a depressed portion.

Preferably, the apparatus of this invention is equipped with heating means capable of heating the uneven portion of the high frequency application electrode, desirably its surface. Particularly preferably, the heating means is built in the uneven portion of the electrode.

The heating means may be one which can heat the uneven portion of the high frequency application electrode to a surface temperature of, for example, 100° to 500° C. Hence, its type is not particularly limited. For example, it may be of the type in which a sheathed heater is embedded in the inside of the electrode. It may be embedded in such a pattern as shown, for example, in FIGS. 2 and 7 to 13 in which as shown at 80, the heating means is embedded in the bottom portion of the high frequency application electrode, or in the raised portions (projections).

It is also preferable to embed a heater shown at 80' in FIGS. 2, 7-11 and 13 in the earth electrode, too, in order to heat the substrate.

A silicon compound gas is a typical example of the reactive gas used in this invention. Examples of the silicon compound include silanes represented by the general formula $Si_nH_{2n+2}$ where n is a natural number, such as monosilane and disilane; fluorosilanes represented by the general formula $SiH_xF_{4-x}$ where x is an integer of 0 to 4; and hydrogenated germanium compounds represented by the general formula $Ge_nH_{2n+2}$ where n is a natural number. Furthermore, depending upon the purpose for which the reactive gas is used, gases of phosphine $PH_3$, diborane $B_2H_6$, helium He, hydrocarbons represented by the formulae $C_yH_{2y+2}$, $C_yH_{2y}$ and $C_yH_{2y-2}$, and organosillanes such as monomethylsilane may be used singly or in combination.

To form a film by using the apparatus of this invention, the substrate held on the substrate holding device is set up in the substrate insertion chamber, and the substrate is heated by the heating means to a predetermined temperature of about 100° to 400° C. while the inside of the chamber is evacuated to 0.01 torr or below, usually to $10^{-3}$ to $10^{-8}$ torr.

In the meantime, the reactive gas is fed into the reaction chamber equipped with the earth electrode and the high frequency application electrode having an uneven surface, and a glow discharge is generated, for example, at a pressure of 0.001 to 10 torr, a temperature of 150° to 350° C. and a high-frequency power of 1 to 5,000 watt.

Then, after the predetermined pressure and substrate temperature are attained, the substrate held on the substrate holding device is introduced into the reaction chamber from the substrate insertion chamber and positioned in an atmosphere of glow discharge. While the substrate is kept in a stationary state or is being continuously transferred, a film is formed on the substrate.

EXAMPLES

EXAMPLE 1

A substrate held on a substrate holding device was set up in a substrate insertion chamber, and while the inside of the chamber was being evacuated to a vacuum of below 0.01 torr, the substrate was heated to a predetermined temperature by means of a heater. After the predetermined pressure and substrate temperature were attained, the substrate was introduced into a reaction chamber in which a glow discharge was generated through a disilane gas by an earth electrode and a high frequency application electrode having an uneven surface (H=20 mm, W=1 mm, L=19 mm) of the type shown in FIG. 2 from the substrate insertion chamber, and fixed to the earth electrode. As a result, an amorphous silicon film was formed on the substrate kept stationary.

The film-forming conditions and results were as follows:

Film-Forming Conditions

Figure 14:
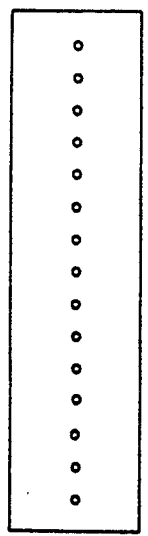
FIGS. 14 and 15 are views illustrating the position of a substrate in working examples in which the distribution of the film-forming speed was measured, the distance between two adjacent points of measurement being 5 mm.

Disilane: 10 cc/min.
High frequency power: 50 watt
Substrate temperature: 250° C.
Reaction pressure: 0.1 torr
Electrode size: 100 mm in diameter
Substrate size: 20×80 mm
Projection width (W): 1 mm
Projection height (H): 20 mm
Recess width (L): 19 mm Result of Film Formation Average film-forming speed: 30 Å/sec Film-forming speed distribution on the substrate (FIG. 14): ±3.5%
Typical photo conductivity: $3.5 \times 10^{-5}$ S/cm
Typical dark conductivity: $4.6 \times 10^{-11}$ S/cm

COMPARATIVE EXAMPLE 1

The same film-forming conditions as in Example 1 were used except that a conventional parallel plate-type high frequency application electrode was used instead of the high frequency application electrode used in Example 1. It was confirmed consequently that the film-forming speed varied between 11 Å/sec and 27 Å/sec., and it was extremely difficult to perform uniform film formation.

EXAMPLE 2

A high frequency application electrode having an uneven surface (projection width W=20 mm, recess width L=20 mm) of the type shown in FIG. 5 was used after the projection height was changed to one shown in FIG. 11.

A stainless steel (SUS 304) holding device (300×230 mm) having inserted therein a glass substrate (250×100 mm) was set up in a substrate insertion chamber, and the substrate was heated to a predetermined temperature while the inside of the chamber was being evacuated to a vacuum of below 0.01 torr. After the predetermined pressure and substrate temperature were reached, the holding device having inserted therein the glass substrate was sent by conveying means to a reaction chamber in which a glow discharge was generated through a disilane gas. While the substrate was passed through the reaction chamber, an amorphous silicon film was formed on it.

The film-forming conditions and results were as follows:

Film-Forming Conditions

Figure 15:
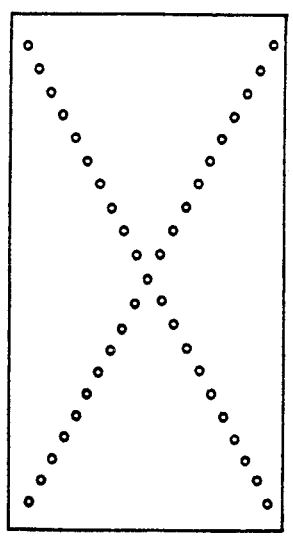

Disilane: 20 cc/min.
High frequency power: 60 watt
Substrate temperature: 300° C.
Reaction pressure: 0.6 torr
Electrode size: 200×200 mm
Substrate size: 250×100 mm
Projection width (W): 20 mm
Projection height (H): $H_1$=20 mm, $H_2$=14 mm, $H_3$=7 mm
Recess width (L): 20 mm Result of Film Formation Average film-forming speed: 25 Å/sec.
Film-forming speed distribution in a direction perpendicular to the machine direction of the substrate: ±5% (FIG. 15)
Typical photo conductivity: $1.0 \times 10^{-5}$ S/cm
Typical dark conductivity: $1.2 \times 10^{-11}$ S/cm

COMPARATIVE EXAMPLE 2

Example 2 was repeated except that the heights of all hills were equally adjusted to 4 mm. Consequently, as shown below, the film-forming speed decreased, and had poor uniformity.
Average film-forming speed: 11 Å/sec.
Film-forming speed distribution in a direction perpendicular to the machine direction of the substrate: ±25% (FIG. 15)
Typical photo conductivity: $0.9 \times 10^{-5}$ S/cm
Typical dark conductivity: $1.5 \times 10^{-11}$ S/cm

EXAMPLE 3

Figure 7:
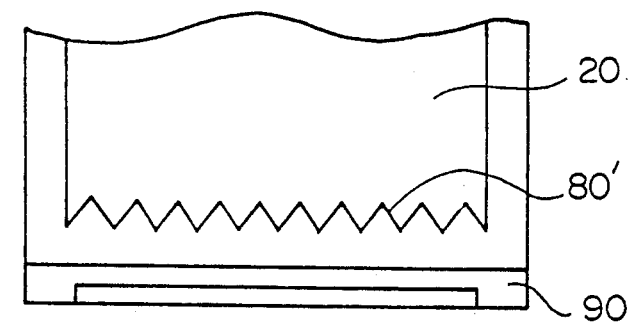
FIGS. 7 to 13 are enlarged views of electrode portions of the film-forming apparatus in embodiments other than that shown in FIG. 2.
Figure 7:
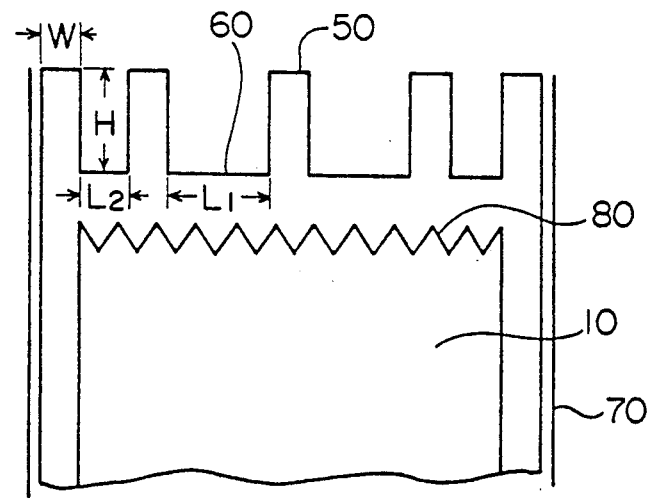
Figure 8:
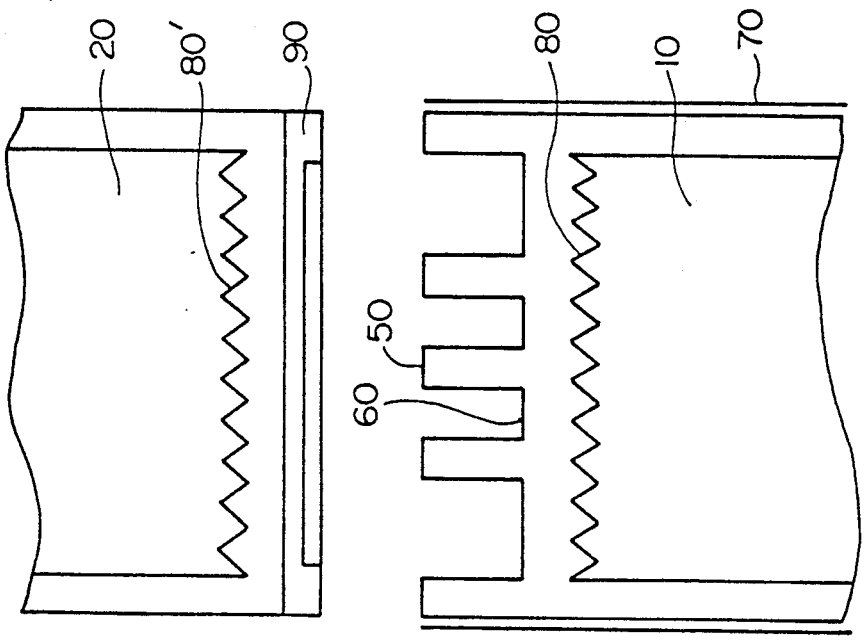

A high frequency application electrode having an even surface of the type shown in FIG. 5 was used after changing it so that as shown in FIG. 7, the width of a recess at an end portion was 10 mm and the width of a recess at a central portion was 20 mm.

A stainless steel (SUS 304) holding device (300×230 mm) having inserted therein a glass substrate (250×100 mm) was set up in a substrate insertion chamber, and the substrate was heated to a predetermined temperature while the inside of the chamber was being evacuated to a vacuum of below 0.01 torr. After the predetermined pressure and substrate temperature were reached, the holding device having inserted therein the glass substrate was sent by conveying means to a reaction chamber in which a glow discharge was generated through a disilane gas. While the substrate was passed through the reaction chamber, an amorphous silicon film was formed on it.

The film-forming conditions and results were as follows:

Film-Forming Conditions

Disilane: 20 cc/min.
High frequency power: 60 watt
Substrate temperature: 300° C.
Reaction pressure: 0.6 torr
Electrode size: 200×200 mm
Substrate size: 250×100 mm
Projection width (W): 8 mmm
Projection height (H): 20 mm
Recess width (L): $L_1$=20 mm, $L_2$=10 mm

Result of Film Formation

Average film-forming speed: 25 Å/sec.
Film-forming speed distribution in a direction perpendicular to the machine direction of the substrate: ±4% (FIG. 15)
Typical photo conductivity: $1.2 \times 10^{-5}$ S/cm
Typical dark conductivity: $1.5 \times 10^{-11}$ S/cm

COMPARATIVE EXAMPLE 3

Example 3 was repeated except that the width ($L_2$) of a at an end portion was changed to 0.4 cm. Consequently, as shown below, the film-forming speed decreased, and had poor uniformity.

Average film-forming speed: 22 Å/sec.
Film-forming speed distribution in a direction perpendicular to the machine direction of the substrate: ±15% (FIG. 15)
Typical photo conductivity: $0.9 \times 10^{-5}$ S/cm
Typical dark conductivity: $1.4 \times 10^{-11}$ S/cm

EXAMPLE 4

High frequency application electrodes having an uneven surface of the type shown in FIG. 5 (W=H=L=20 mm) were aligned at intervals of 50 mm in the arrangement shown in FIG. 6. A sheathed electric heater built in the electrode was energized to maintain the surface temperature of the electrode at 150° C. or higher.

A stainless steel (SUS 304) holding device (300×230 mm) having inserted therein a glass substrate (250×100 mm) was set up in a substrate insertion chamber, and the substrate was heated to a predetermined temperature while the inside of the chamber was being evacuated to a vacuum of below 0.01 torr. After the predetermined pressure and substrate temperature were reached, the holding device having inserted therein the glass substrate was sent by conveying means to a reaction chamber in which a glow discharge was generated through a disilane gas. While the substrate was passed through the reaction chamber, an amorphous silicon film was formed on it.

The film-forming conditions and results were as follows:

Film-Forming Conditions

Disilane: 20 cc/min.
High frequency power: 60 watt
Surface temperature of the high frequency application
electrode: 150° C.
Substrate temperature: 300° C.
Reaction pressure: 0.6 torr
Electrode size: 200×200 mm
Substrate size: 250×100 mm
Projection width (W): 20 mm
Projection height (H): 20 mm
Recess width (L): 20 mm

Result of Film Formation

Average film-forming speed: 25 Å/sec.
Film-forming speed distribution in a direction perpendicular to the machine direction of the substrate: ±5% (FIG. 15)
Typical photo conductivity: $7.0 \times 10^{-5}$ S/cm
Typical dark conductivity: $5.5 \times 10^{-11}$ S/cm

COMPARATIVE EXAMPLE 4

Example 4 was repeated except that the high frequency application electrode was not heated. Without heating, the surface of the electrode had a temperature of 75° C. The film-forming speed did not change. But the photo conductivity decreased to $6.8 \times 10^{-6}$ S/cm, and the dark conductivity decreased to $5.2 \times 10^{-12}$ S/cm.

EXAMPLE 5

Figure 9:
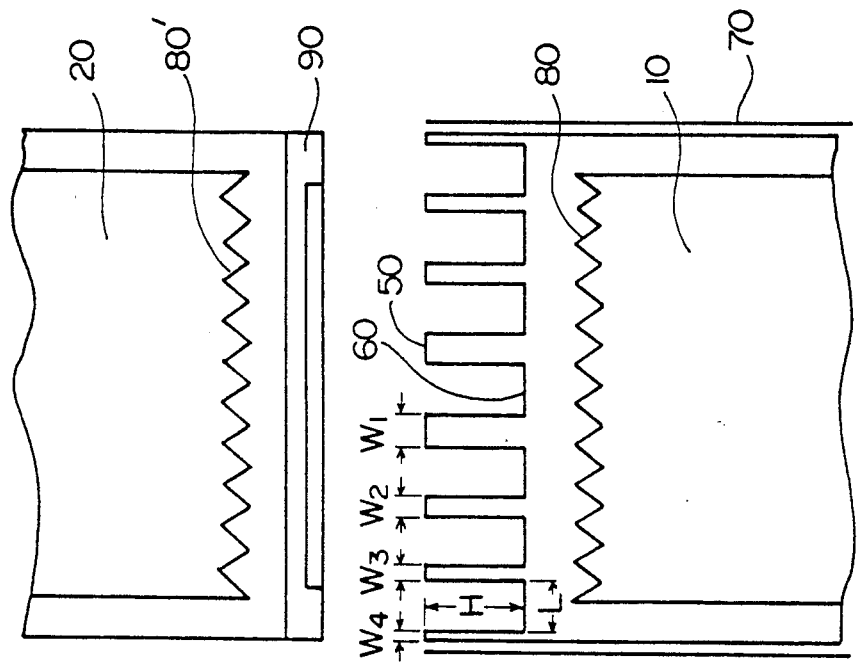
Figure 10:
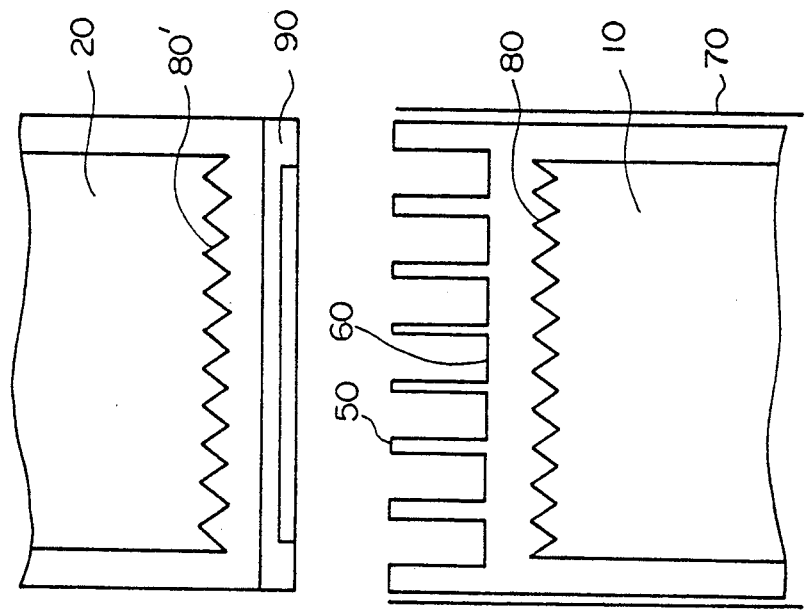
Figure 13:
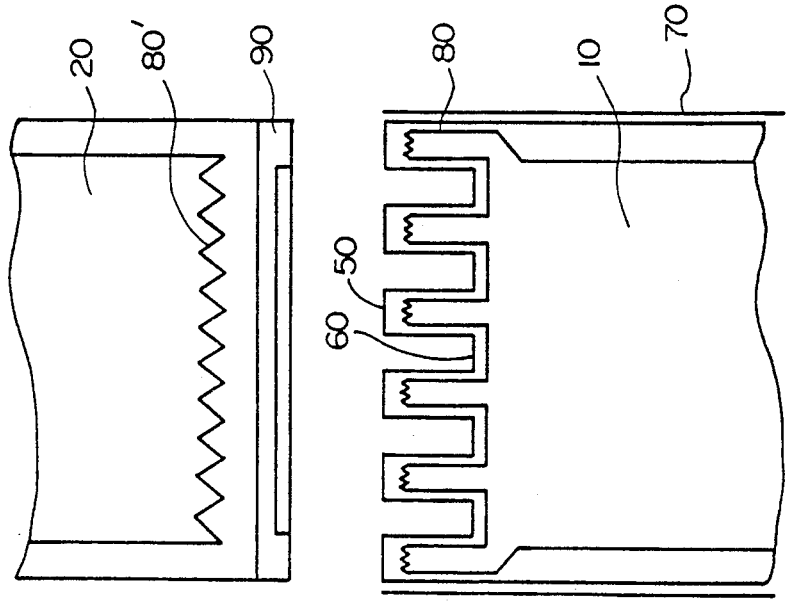

A high frequency application electrode having an uneven surface of the type shown in FIG. 5 (projection height H=20 mm; width L=12 mm; the width of projections varying as shown in FIG. 9) was used.

A stainless steel (SUS 304) holding device (300×230 mm) having inserted therein a glass substrate (250×100 mm) was set up in a substrate insertion chamber, and the substrate was heated to a predetermined temperature while the inside of the chamber was being evacuated to a vacuum of below 0.01 torr. After the predetermined pressure and substrate temperature were reached, the holding device having inserted therein the glass substrate was sent by conveying means to a reaction chamber in which a glow discharge was generated through a disilane gas, and while the substrate was passed through the reaction chamber, an amorphous silicon film was formed on it.

The film-forming conditions and results were as follows:

Film-Forming Conditions

Disilane: 20 cc/min.
High frequency power: 60 watt
Substrate temperature: 300° C.
Reaction pressure: 0.6 torr
Electrode size: 200×200 mm Substrate size: 250 × 100 mm
Projection width (W): $W_1 = 20$ mm, $W_2 = 15$ mm, $W_3 = 13$ mm, $W_4 = 10$ mm
Projection height (H): 20 mm
Recess width (L): 12 mm Result of Film Formation Average film-forming speed: 25 Å/sec.
Film-forming speed distribution in a direction perpendicular to the machine direction of the substrate: ±4% (FIG. 15)
Typical photo conductivity: $1.2 \times 10^{-5}$ S/cm
Typical dark conductivity: $1.4 \times 10^{-11}$ S/cm

COMPARATIVE EXAMPLE 5

Example 5 was repeated except that the width $W_4$ of the end was changed to 30 mm. Consequently, as shown below, the film-forming speed decreased, and had poor uniformity.

Average film-forming speed: 22 Å/sec.
Film-forming speed distribution in a direction perpendicular to the machine direction of the substrate: ±15% (FIG. 15)
Typical photo conductivity: $1.0 \times 10^{-5}$ S/cm
Typical dark conductivity: $2.0 \times 10^{-11}$ S/cm

INDUSTRIAL UTILIZABILITY

As a result of using a high frequency application electrode having an uneven surface of a specific shape, a film can be formed uniformly on a substrate having a large area at a high film-forming speed. The resulting film has excellent properties, and the industrial utilizability of the present invention is very great.

We claim:

1. An apparatus for forming a thin film on a substrate, comprising a high frequency application electrode, an earth electrode and the substrate positioned between these electrodes, said high-frequency application electrode having an uneven surface with at least two projections and at least one recess, each of the distance D between the apex of each of said at least two projections and said substrate being 20 mm ≦ D ≦ 500 mm, the projections having different widths so that the film forming speed becomes uniform.

2. An apparatus for forming a thin film on a substrate, comprising a high frequency application electrode, an earth electrode and the substrate positioned between these electrodes, said high-frequency application electrode having an uneven surface with at least two projections and at least one recess, each of the distance D between the apex of each of said at least two projections and said substrate being 20 mm ≦ D ≦ 500 mm, the projections having different widths according to their positions on the surface of the high frequency application electrode so that the film-forming speed becomes uniform.

3. An apparatus for forming a thin film on a substrate, comprising a high-frequency application electrode, an earth electrode and the substrate positioned between these electrodes, said high-frequency application electrode having an uneven surface with at least one projection and at least two recesses, each of the distance D between the apex of each of said at least one projection and said substrate being 20 mm ≦ D ≦ 500 mm, the recesses having different widths according to their positions on the surface of the high frequency application electrode so that the film-forming speed becomes uniform.

4. An apparatus for forming a thin film on a substrate, comprising a high frequency application electrode, an earth electrode and the substrate positioned between these electrodes, said high-frequency application electrode having an uneven surface with at least two projections and at least one recess, each of the distance D between the apex of each of said at least two projections and said substrate being 20 mm ≦ D ≦ 500 mm, the projections having different heights according to their positions on the surface of the high frequency application electrode so that the film-forming speed becomes uniform.

* * * * *